(12) United States Patent
Verhaverbeke

(10) Patent No.: US 7,358,196 B2
(45) Date of Patent: Apr. 15, 2008

(54) WET CHEMICAL TREATMENT TO FORM A THIN OXIDE FOR HIGH K GATE DIELECTRICS

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/052,160

(22) Filed: Feb. 7, 2005

(65) Prior Publication Data

US 2006/0178015 A1 Aug. 10, 2006

(51) Int. Cl.
*H01L 21/302* (2006.01)
*H01L 21/461* (2006.01)

(52) U.S. Cl. ........................ 438/756; 438/723; 438/743; 438/905; 257/E21.244; 257/E21.251; 257/E21.309; 257/E21.335

(58) Field of Classification Search ................ 438/756, 438/905, 723, 743, 680, 689
See application file for complete search history.

(56) References Cited

U.S. PATENT DOCUMENTS 6,010,942 A * 1/2000 Chien et al. ................ 438/396
6,379,577 B2 * 4/2002 Akatsu et al. .............. 216/108
7,045,073 B2 * 5/2006 Hareland et al. ............. 216/87
2001/0037995 A1 * 11/2001 Akatsu et al. .............. 216/100

* cited by examiner

*Primary Examiner*—David Nhu
(74) *Attorney, Agent, or Firm*—Blakely, Sokoloff, Taylor & Zafman LLP

(57) ABSTRACT

Described herein are methods of forming a thin silicon dioxide layer having a thickness of less than eight angstroms on a semiconductor substrate to form the bottom layer of a gate dielectric. A silicon dioxide layer having a thickness of less than eight angstroms may be formed by two different methods. In one method, a sulfuric acid solution is applied to a semiconductor substrate to grow a silicon dioxide layer of less than eight angstroms. The growth of the silicon dioxide layer by the sulfuric acid solution is self-limiting. In another method, a hydrogen peroxide containing solution is applied to a semiconductor substrate for a time sufficient to grow a silicon dioxide layer having a thickness of greater than eight angstroms and then applying an etching solution to etch the silicon dioxide layer down to a thickness of less than eight angstroms.

22 Claims, 6 Drawing Sheets

WET CHEMICAL TREATMENT TO FORM A THIN OXIDE FOR HIGH K GATE DIELECTRICS

BACKGROUND OF THE INVENTION

1. Field of the Invention

The present invention relates to the field of semiconductor fabrication and more particularly forming high dielectric constant gate dielectrics for a transistor gate.

2. Discussion of Related Art

High dielectric constant (k) gate dielectric layers are valuable in scaling down the dimensions of transistors. This is because, in order to make the gate dielectric layer thinner and smaller in area while still maintaining a high capacitance for the transistor, the dielectric constant of the gate dielectric layer must be increased. A high dielectric constant material is defined as a material having a dielectric constant greater than approximately 4 (the dielectric constant of silicon dioxide). High dielectric constant materials include $HfO_2$, $Si_3N_4$, $Ta_2O_3$, and PZT ($PbZrTiO_3$). Ideally, a high dielectric constant material would be deposited directly onto a semiconductor substrate to form a gate dielectric layer. But, the atomic layer deposition (ALD) process that is used to deposit high dielectric constant materials, such as $HfO_2$, onto a semiconductor substrate cannot deposit the high dielectric constant materials directly onto a semiconductor substrate, such as silicon. High dielectric constant materials may be deposited by ALD onto an oxide surface, such as silicon dioxide. Therefore, by forming an oxide surface on a semiconductor substrate, the high dielectric constant material may be deposited onto the oxide surface of the semiconductor substrate. But, silicon dioxide has a relatively low dielectric constant as compared to the high dielectric constant materials such as $HfO_2$. Silicon dioxide has a dielectric constant of approximately 4, and $HfO_2$ has a dielectric constant of approximately 20. The overall dielectric constant of a gate dielectric formed of silicon dioxide and a high dielectric constant material will be lower than that of the high dielectric constant material alone. Therefore, the silicon dioxide layer must be as thin as possible, and ideally only as thick as a monolayer of silicon dioxide (2 angstroms) to minimize the effect that the silicon dioxide has of lowering the overall dielectric constant of the gate dielectric layer.

SUMMARY OF THE INVENTION

Described herein are methods of forming a thin silicon dioxide layer having a thickness of less than eight angstroms on a semiconductor substrate to form the bottom layer of a gate dielectric. A silicon dioxide layer having a thickness of less than eight angstroms may be formed by two different methods. In one method, a sulfuric acid solution is applied to a semiconductor substrate to grow a silicon dioxide layer of less than eight angstroms. The growth of the silicon dioxide layer by the sulfuric acid solution is self-limiting. In another method, a hydrogen peroxide containing solution is applied to a semiconductor substrate for a time sufficient to grow a silicon dioxide layer having a thickness of greater than eight angstroms and then applying an etching solution to etch the silicon dioxide layer down to a thickness of less than eight angstroms.

DETAILED DESCRIPTION OF THE PRESENT INVENTION

In the following description numerous specific details are set forth in order to provide a thorough understanding of the present invention. One of ordinary skill in the art will understand that these specific details are for illustrative purposes only and are not intended to limit the scope of the present invention. Additionally, in other instances, well-known processing techniques and equipment have not been set forth in particular detail in order to not unnecessarily obscure the present invention.

Described herein are methods of forming a thin silicon dioxide layer having a thickness of less than eight angstroms on a semiconductor substrate to form the bottom layer of a gate dielectric. The semiconductor substrate may be, for example, silicon, silicon germanium, or germanium. A silicon dioxide layer having a thickness of less than eight angstroms may be formed by two different methods. In one method, a sulfuric acid solution is applied to a semiconductor substrate to grow a silicon dioxide layer of less than eight angstroms. The growth of the silicon dioxide layer by the sulfuric acid solution is self-limiting. In another method, a hydrogen peroxide containing solution is applied to a semiconductor substrate for a time sufficient to grow a silicon dioxide layer having a thickness of greater than eight angstroms and then applying an etching solution to etch the silicon dioxide layer down to a thickness of less than eight angstroms.

Figure 1A:
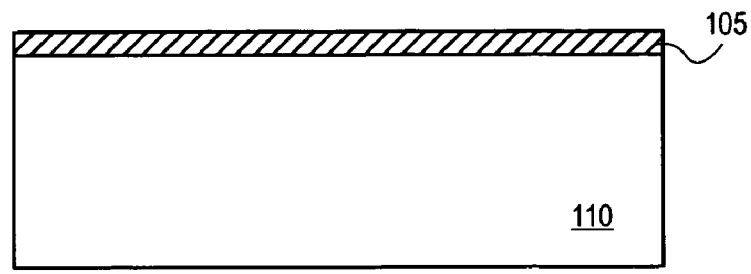
FIGS. 1a-1f illustrate a cross-sectional view of a substrate on which a silicon dioxide layer is formed according to an embodiment of the current invention to form part of a gate dielectric of a transistor.
Figure 1B:
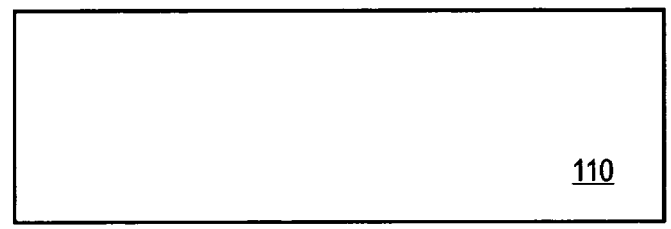
Figure 2:
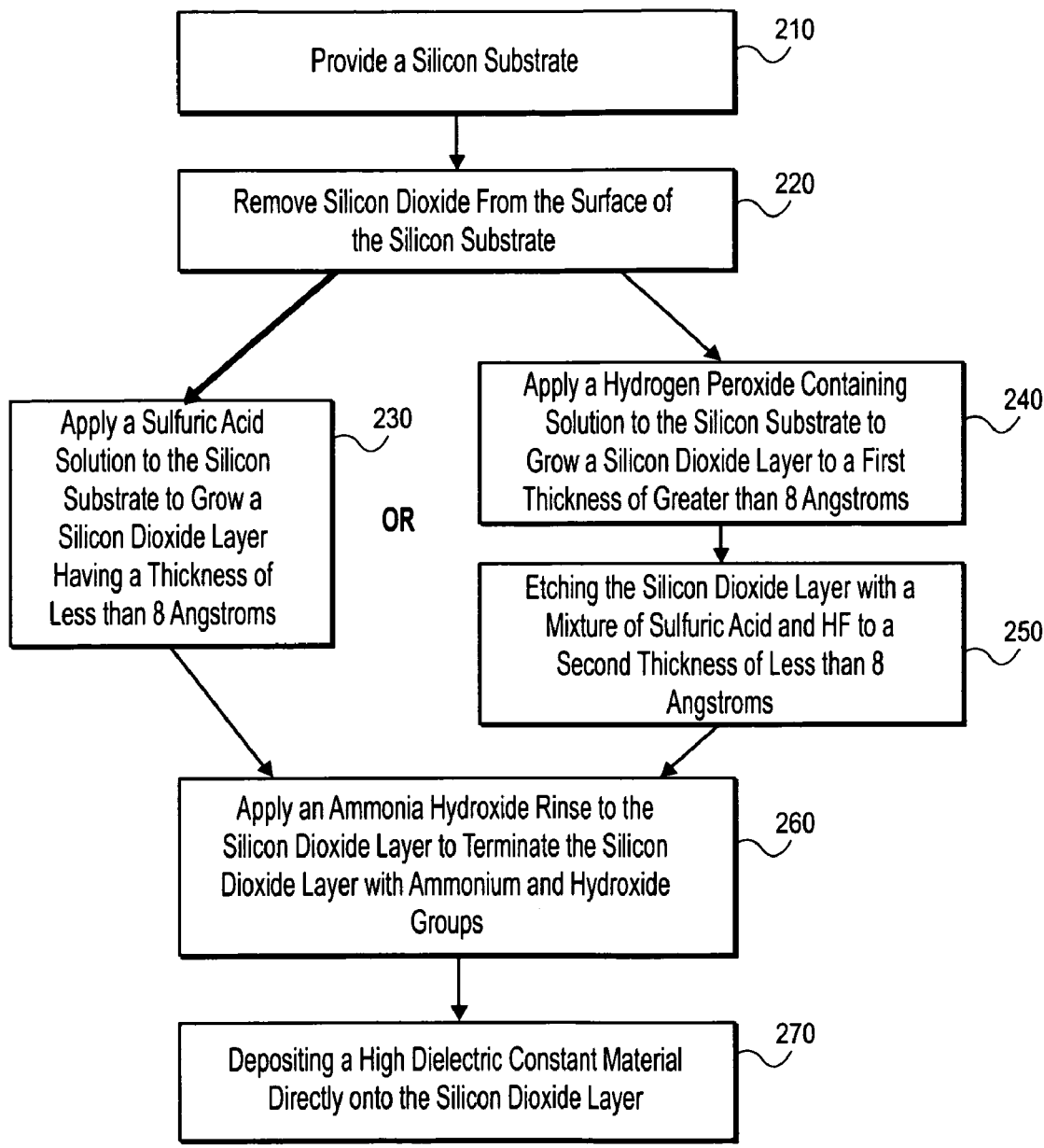
FIG. 2 is a flow chart of the methods of forming a silicon dioxide layer on a semiconductor substrate according to embodiments of the current invention.
Figure 3:
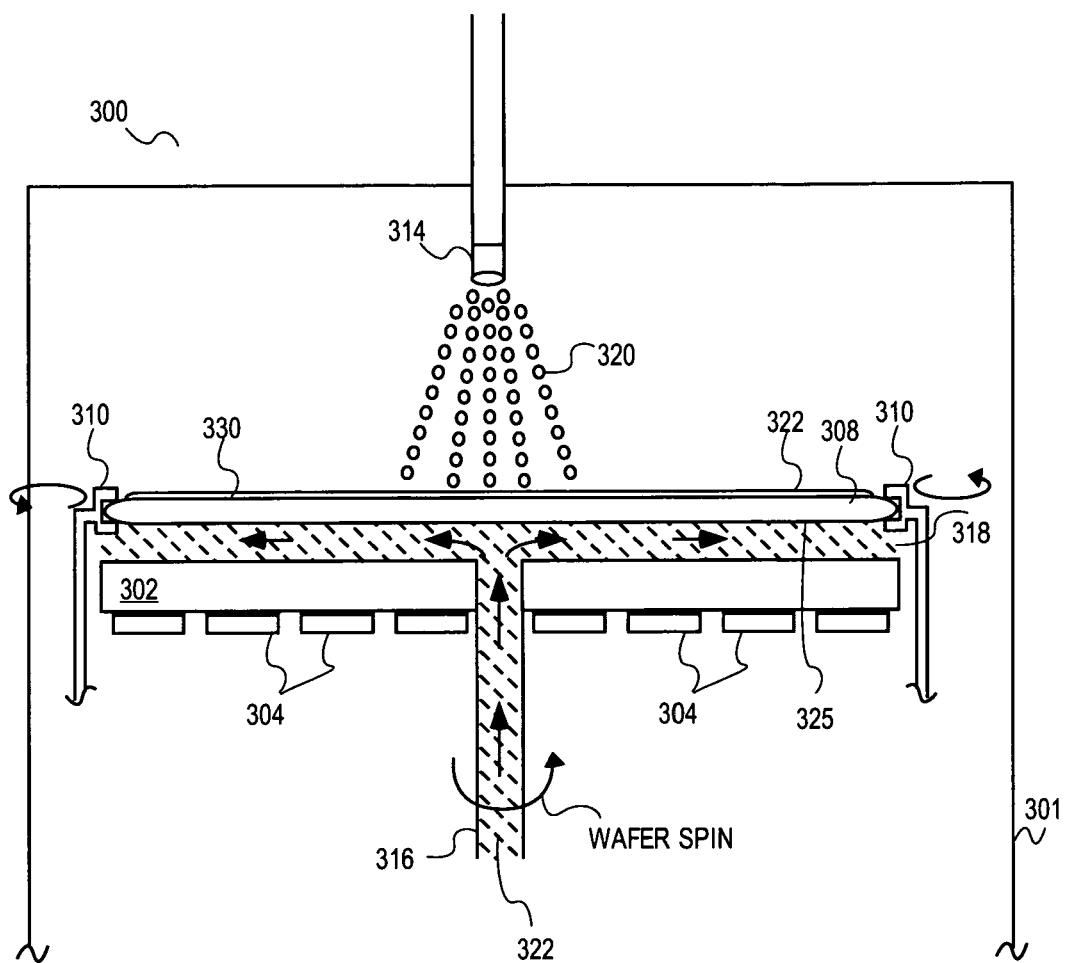
FIG. 3 is an illustration of a cross-sectional view of a single wafer processing apparatus.

In FIG. 1a, and at block 210 of FIG. 2, a semiconductor substrate 110 is provided. This semiconductor substrate 110 may be a monocrystalline silicon substrate. A silicon dioxide layer 105 may be present on the surface of the semiconductor substrate 110. This silicon dioxide layer 105 may be a native oxide having a thickness in the approximate range of 8 angstroms and 10 angstroms that would be too thick to be used as the base for a high k dielectric gate electrode and should therefore be removed to form a thinner silicon dioxide layer to serve as part of a high-k gate dielectric. The native silicon dioxide layer is removed at block 220 of FIG. 2 to form the semiconductor substrate illustrated in FIG. 1b. To remove the silicon dioxide layer 105 the semiconductor substrate 110 may be placed in a single substrate processing apparatus 300 such as the one illustrated in FIG. 3. FIG. 3 is an illustration of one embodiment of a horizontal spinning single wafer cleaning apparatus 300. As shown in FIG. 3, the single wafer cleaning apparatus 300 may be contained within a housing 301. The single wafer cleaning apparatus includes a wafer holding bracket 310. Once the semiconductor substrate 308 is placed onto the bracket 310, the bracket 310 may be lowered to a process position as illustrated. This process position may place the semiconductor substrate 308 a short distance above a circular plate 302. The circular plate 302 can contain transducers 304 that are capable of emitting sound in the megasonic frequency range. A fluid feed port 316 can be added to the transducer plate 302 to fill an approximate 3 millimeter (mm) gap 318 between the transducer plate 302 and the bottom side of the semiconductor substrate 310 with a liquid 322 at various times during processing of the semiconductor substrate 310. The liquid 322 can act as a carrier for transferring megasonic energy onto a semiconductor substrate bottom surface 325 or as a way to heat the wafer if the liquid 322 is hot. At least one nozzle 314 can be positioned to direct flow of a gas, vapor, or a liquid onto the top semiconductor substrate surface 330. In one embodiment of the invention, the nozzle 314 may dispense a liquid solution to contact the top semiconductor substrate surface 330. The entire top semiconductor substrate surface 330 may be covered with a liquid solution by dispensing a liquid solution onto a horizontally positioned semiconductor substrate 308. The semiconductor substrate 308 may be a wafer having any diameter, but may, for example, have a 300 mm diameter or a 450 mm diameter. The semiconductor substrate 110 may be monocrystalline silicon wafer 308 placed on wafer holding bracket 310.

The silicon dioxide layer 105 may be removed with a hydrofluoric acid (HF) rinse. The HF rinse may be approximately 0.5% by weight HF in deionized water and the rinse may have an etch rate of the native or sacrificial silicon dioxide layer 105 of approximately 20 angstroms/minute. The HF rinse may be dispensed onto the wafer 308 as a spray 320 or as a straight dispense to form a layer of the solution 322 on the surface of the wafer 308. The HF rinse may be dispensed onto the wafer 308 while the wafer is spinning. The HF rinse does not etch the silicon substrate 110 and may therefore be applied to the silicon substrate 110 for a time sufficient to remove all native or sacrificial silicon dioxide 105. The HF rinse may then be removed from the silicon substrate 110 with a DI-water rinse and by spinning off the rinses at a spin rate sufficient to spin off the liquid. The semiconductor substrate 110 may be the silicon wafer 308. The silicon wafer 308 may remain in the single substrate processing tool 300 after the native silicon dioxide layer 105 is removed.

Figure 1C:
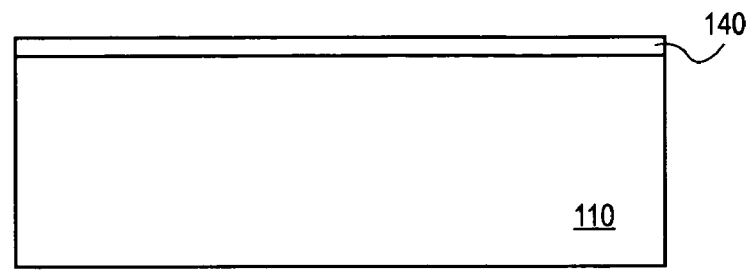
Figure 1D:
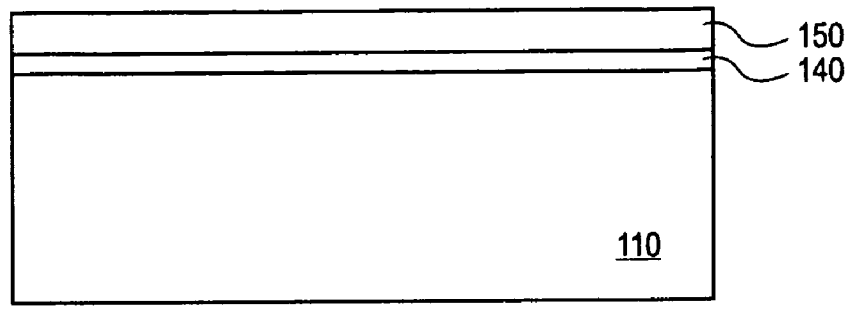
Figure 1E:
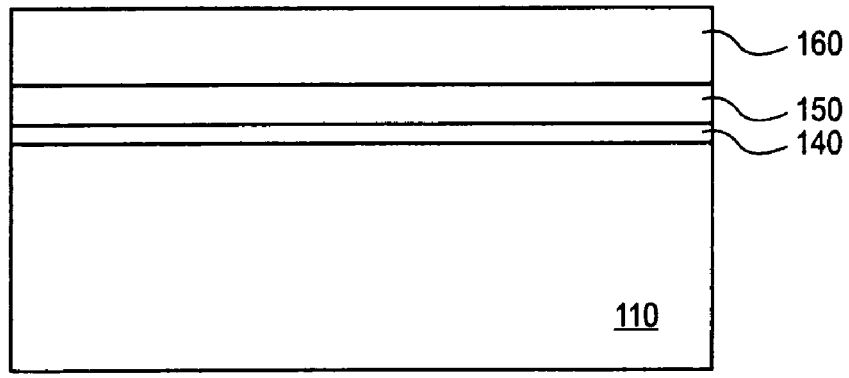

A silicon dioxide layer 140 may then be grown on the pure silicon surface of the semiconductor substrate 110, as illustrated at FIG. 1c. The silicon dioxide layer 140 may be grown to have a thickness of less than 8 angstroms at block 230 or it may be grown to have a thickness of greater than 8 angstroms at block 240 and then etched back to a thickness of less than 8 angstroms at block 250. To grow the silicon dioxide layer 140 to a thickness of less than 8 angstroms a sulfuric acid solution is applied to the semiconductor substrate 110. The sulfuric acid solution may be in the approximate range of 95% to 100% sulfuric acid. A high concentration sulfuric acid solution is used because it provides the best oxidation of the silicon surface. When the sulfuric acid solution is not 100% sulfuric acid, the balance of the solution is water. In one particular embodiment the sulfuric acid solution may be 98% by weight sulfuric acid and approximately 2% by weight water. At block 230 in the first embodiment, the sulfuric acid solution is applied to the silicon substrate. The sulfuric acid solution may be dispensed as a spray 320 onto the spinning wafer 308 having a pure silicon surface. During dispensation of the sulfuric acid solution the wafer 308 may be spinning at a rate in the approximate range of 5 rpm and 50 rpm. The sulfuric acid solution may be applied to the silicon substrate for a time sufficient to grow a silicon dioxide layer having a thickness of less than 8 angstroms. The amount of time that the sulfuric acid solution is applied to the semiconductor substrate 110 may be in the approximate range of 30 seconds and 50 seconds. The growth of the silicon dioxide layer by the high concentration sulfuric acid solution is self-limiting, meaning that growth of the silicon dioxide layer will stop once it reaches a thickness of less than 8 angstroms regardless of whether the high concentration sulfuric acid solution is still in contact with the silicon substrate. Therefore, the sulfuric acid solution may be left on the wafer 308 indefinitely, even after the silicon dioxide layer has been grown. In one embodiment the growth of the silicon dioxide may stop at a thickness in the approximate range of 2 angstroms (a monolayer) and 4 angstroms. It is valuable that the thickness of the silicon dioxide layer 140 be as thin as possible so that it has a minimal effect on lowering the overall dielectric constant of the gate electrode. The sulfuric acid solution may be spun off of the wafer 308 at a spin rate in the approximate range of 100 rpm and 300 rpm. An ammonia hydroxide rinse may then be applied to the silicon dioxide layer to further remove any remaining sulfuric acid residues that may continue to build the silicon dioxide layer. Deionized water may then be applied to the surface of the wafer 308 and the surface of the wafer 308 may be dried by spinning the wafer 308 at a spin rate in the approximate range of 750 rpm and 1000 rpm.

At block 240, in the second embodiment, a solution containing hydrogen peroxide such as an SC1 solution ($NH_4OH$, $H_2O_2$, and $H_2O$) or an SPM solution (sulfuric peroxide mixture), is applied to the semiconductor substrate 110 to grow a silicon dioxide layer to a first thickness of greater than 8 angstroms. The solution containing hydrogen peroxide may be applied to the semiconductor substrate 110 in a single substrate processing tool 300 by dispensing the solution containing hydrogen peroxide onto a spinning wafer 308 as a spray 320 or as a simple dispense. After growing the silicon dioxide layer 140 to a first thickness of greater than 8 angstroms and more particularly to approximately 10 angstroms in thickness, the sulfuric acid solution may be spun off of the wafer 308. Because the growth of the silicon dioxide layer levels off at about a thickness of 8 angstroms to 10 angstroms in the presence of the hydrogen peroxide containing solution, it may not be necessary to immediately remove the hydrogen peroxide containing solution and rinse the silicon dioxide surface. The hydrogen peroxide containing solution may be removed by rinsing the silicon surface with a deionized water rinse dispensed from the nozzle 314 and then spun off of the wafer 308. Deionized water may applied to the surface of the wafer 308 and the surface of the wafer 308 may then be dried by spinning the wafer 308 at a spin rate in the approximate range of 750 rpm and 1000 rpm.

At block 250 the silicon dioxide layer 140 is etched back with a mixture of sulfuric acid and hydrofluoric acid (HF). The mixture of sulfuric acid and HF may be applied to the semiconductor substrate 110 on wafer 308 within the single substrate processing apparatus 300 as a spray 320 from nozzle 314 to form a layer of the mixture 322. The mixture of sulfuric acid and HF may be applied to the silicon dioxide layer until the thickness of the silicon dioxide layer 140 remaining is less than 8 angstroms and more particularly in the approximate range of 2 angstroms (a monolayer) and 4 angstroms. The time that the mixture of sulfuric acid and HF is applied to the silicon dioxide layer may be determined by the etch rate of the mixture depending on the concentration of the HF in the mixture. The greater the concentration of HF, the greater the etch rate. The etch rate of the silicon dioxide layer 140 by the mixture of sulfuric acid and HF may be in the approximate range of 0.1 angstroms/second and 10 angstroms/second. The mixture of sulfuric acid and HF may be in the approximate range of 90%-98% by weight sulfuric acid, and 0.1-10% by weight HF. More particularly, the mixture of sulfuric acid and HF may be approximately 98% by weight sulfuric acid, approximately 1% by weight HF, and approximately 1% by weight water and the etch rate of the silicon dioxide layer 140 by the mixture of sulfuric acid and HF may be approximately 1 angstrom/second. Once the silicon dioxide layer 140 is etched back to the target thickness, the mixture of sulfuric acid and HF is immediately spun off of the wafer 308 by spinning the wafer at a spin rate sufficient to completely remove the mixture and stop the etching of the silicon dioxide layer. A deionized water rinse may be applied to the silicon dioxide layer to remove any remaining etching solution.

Figure 4A:
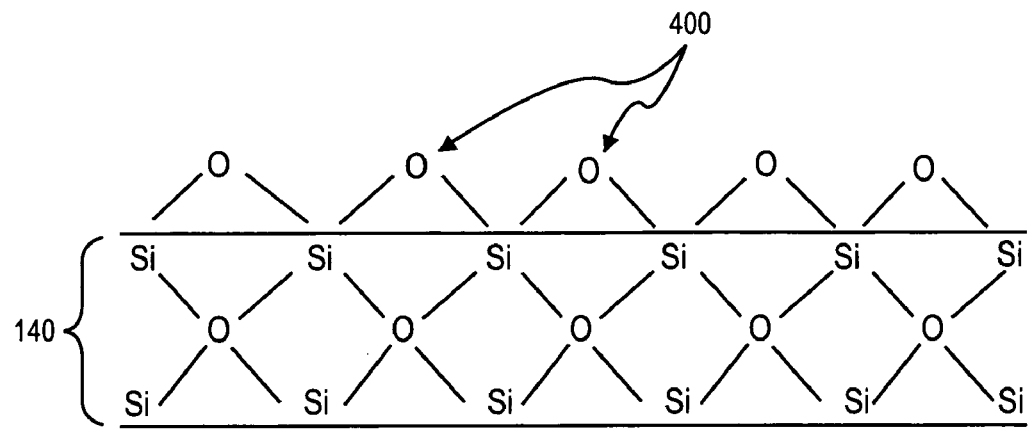
FIGS. 4a and 4b illustrate embodiments of different termination groups on the surface of a silicon dioxide layer.
Figure 4B:
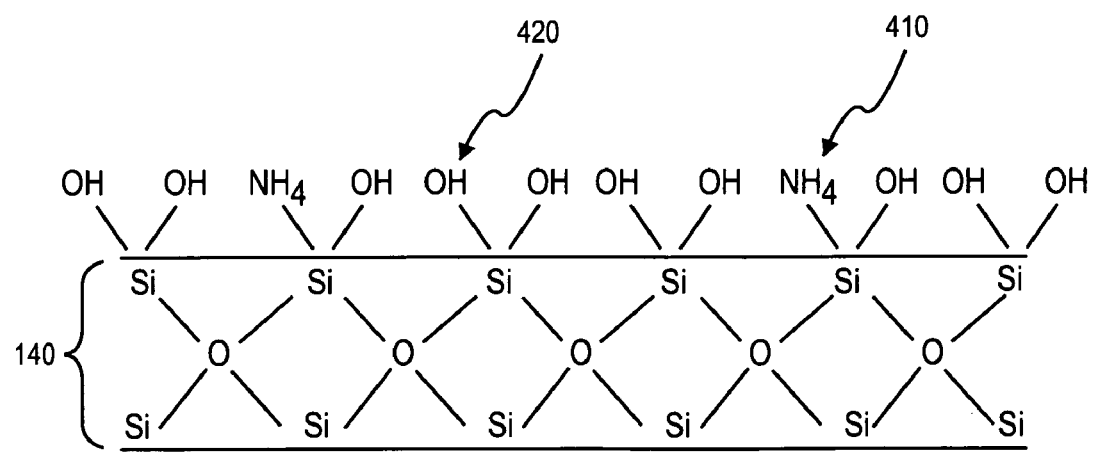

As illustrated in FIG. 4a, the silicon dioxide layer 140 may be terminated by oxygen bridges 400 after it is grown on the semiconductor substrate 110. The oxygen bridge 400 termination of the silicon dioxide layer 140 is not an ideal termination for the deposition of a high k dielectric layer 150 by atomic layer deposition. The atomic layer deposition of a high k dielectric layer 150 may be optimized by terminating the surface of the silicon dioxide layer 140 with ammonium groups 410 and/or hydroxide groups 420 prior to the deposition of the high k dielectric layer. Additionally, terminating the surface of the silicon dioxide layer 140 with ammonium groups 410 and/or hydroxide groups 420 may result in a higher overall dielectric constant for the gate dielectric than the oxygen bridge termination 400. FIG. 4b illustrates the silicon dioxide layer 140 after termination of the silicon atoms at the surface by ammonium groups 410 and hydroxide groups 420. To terminate the silicon atoms of the silicon dioxide layer 140 with ammonium groups 410 and hydroxide groups 420 an ammonium hydroxide rinse may be applied to the silicon dioxide layer 140 at block 260 of FIG. 2. The ammonium hydroxide rinse may be a low concentration of ammonium hydroxide diluted in water. The ratio of ammonium hydroxide to water in the ammonium hydroxide solution may be in the approximate range of 750:1 and 250:1, and more particularly the ratio of ammonium hydroxide to water may be 500:1. This ammonium hydroxide solution may be applied to the surface of the silicon dioxide layer 140 in the single substrate processing apparatus 300. The ammonium hydroxide solution may be dispensed on the silicon dioxide layer 140 on wafer 308 as a spray 320 or as a simple dispense from nozzle 314 while the wafer 308 is spinning at a rate in the approximate range of 5 rpm and 50 rpm. The ammonium hydroxide solution 322 may be left on the surface of the silicon dioxide layer 140 for a time sufficient to terminate all of the oxygen bridges 400 on the silicon dioxide layer 140 with ammonium groups 410 or hydroxide groups 420. Most of the silicon atoms of the silicon dioxide layer will be terminated by hydroxide groups 420 and approximately 1%-10% of the silicon atoms may be terminated by ammonium groups. The percentage of the silicon atoms on the silicon dioxide layer that will be terminated with ammonium groups is higher with a greater concentration of ammonium hydroxide in the solution. The ammonium hydroxide solution also serves to remove sulfuric acid residues from the surface of the silicon dioxide layer 140. Because of the limited number of silicon atoms that may be terminated at the surface of the silicon dioxide layer, the termination of the silicon atoms is also a self-limiting reaction. The ammonium hydroxide solution may be removed from the surface of the wafer 308 by spinning the wafer at a spin rate in the approximate range of 100 rpm and 300 rpm.

Figure 1F:
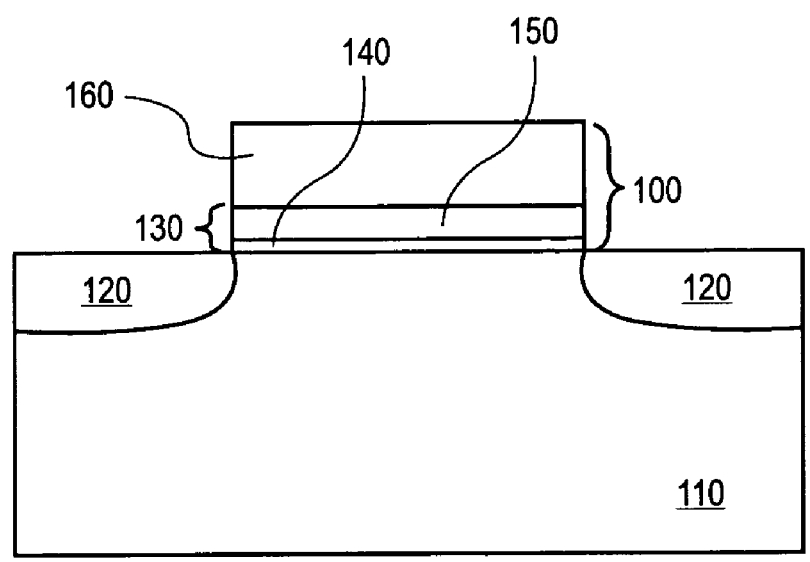

The wafer 308 having the silicon substrate 110 may then be removed from the single wafer processing apparatus 300 and placed in an atomic layer deposition chamber. There, by atomic layer deposition, a layer of high k dielectric material 150 is deposited over the silicon dioxide layer 140. Atomic layer deposition (ALD) utilizes pairs of precursor gas pulses to deposit a film one monolayer at a time. ALD is therefore a method where the exact thickness of the film being formed may be controlled, which is valuable in forming a high k dielectric material. In one particular embodiment, the high k dielectric material may be halfnium oxide ($HfO_2$) that has a dielectric constant of approximately 20. A gate electrode material 160 is then formed over the high k dielectric material 150. The gate electrode material 160 may be polysilicon, metal, or a combination of polysilicon and metal. The gate electrode material 160, the high k dielectric layer 150, and the silicon dioxide layer 140 may then be etched to form a transistor gate 100 illustrated in FIG. 1f. The transistor gate is formed of the gate dielectric 130 and the gate electrode 160. The semiconductor substrate 100 may then have source and drain regions 120 formed by an implant of dopants that is self-aligned with the transistor gate structure.

It is to be appreciated that the disclosed specific embodiments are only meant to be illustrative of the present invention and one of ordinary skill in the art will appreciate the ability to substitute features or to eliminate disclosed features. As such, the scope of the Applicant's invention is to be measured by the appended claims that follow.

I claim:

1. A method, comprising:
   applying a high concentration sulfuric acid solution to a semiconductor substrate to grow a silicon dioxide layer; and
   applying an ammonia hydroxide rinse to the silicon dioxide layer to terminate the silicon dioxide layer with hydroxide groups and ammonium groups,
   wherein applying the ammonia hydroxide rinse to the silicon dioxide layer to terminate the silicon dioxide layer with hydroxide groups comprises terminating approximately 1%-10% of silicon atoms at a surface of the silicon dioxide layer with ammonium groups.

2. The method of claim 1, wherein applying the high concentration sulfuric acid solution comprises applying a concentration of sulfuric acid of approximately 98% by weight.

3. The method of claim 1, wherein applying a high concentration sulfuric acid solution to the semiconductor substrate to grow a silicon dioxide layer comprises growing a silicon dioxide layer of less than 8 angstroms.

4. The method of claim 1, wherein applying a high concentration sulfuric acid solution to the semiconductor substrate to grow a silicon dioxide layer comprises growing a monolayer of silicon dioxide.

5. The method of claim 1, wherein applying the ammonia hydroxide rinse comprises applying the ammonia hydroxide rinse comprising water and ammonia hydroxide in the ratio of 500:1 by weight.

6. The method of claim 1, further comprising removing a layer of native silicon dioxide from the surface of the semiconductor substrate before applying the sulfuric acid solution to the semiconductor substrate.

7. The method of claim 1, further comprising depositing a high dielectric constant material directly on to the silicon dioxide layer.

8. The method of claim 7, wherein depositing the high dielectric constant material comprises depositing halfnium oxide by atomic layer deposition.

9. A method, comprising:
providing a semiconductor substrate;
applying a hydrogen peroxide containing solution to the semiconductor substrate to grow a silicon dioxide layer to a first thickness; and
etching the silicon dioxide layer with a mixture of sulfuric acid and HF to a second thickness less thick than the first thickness.

10. The method of claim 9, wherein applying the hydrogen peroxide containing solution to the semiconductor substrate to grow the layer of silicon dioxide comprises growing the layer of silicon dioxide to a thickness of approximately 10 angstroms.

11. The method of claim 9, wherein etching the layer of silicon dioxide comprises etching the layer of silicon dioxide to the thickness of less than 4 angstroms.

12. The method of claim 9, wherein etching the layer of silicon dioxide comprises etching the layer of silicon dioxide to a monolayer of silicon dioxide.

13. The method of claim 9, further comprising applying an ammonia hydroxide rinse to the silicon dioxide layer to terminate the silicon dioxide layer with hydroxide groups and ammonium groups.

14. The method of claim 9, wherein applying the hydrogen peroxide containing solution to the semiconductor substrate to grow the layer of silicon dioxide comprises applying an SC1 solution to the semiconductor substrate.

15. The method of claim 9, wherein applying the hydrogen peroxide containing solution to the semiconductor substrate to grow the layer of silicon dioxide comprises applying an SPM solution to the semiconductor substrate.

16. A method, comprising:
removing a first silicon dioxide layer from a silicon substrate;
applying a sulfuric acid solution to the silicon substrate to grow a silicon dioxide layer having a thickness in the approximate range of 2 angstroms and 4 angstroms on the silicon substrate;
applying an ammonium hydroxide solution to the silicon dioxide layer to terminate the silicon dioxide layer with ammonium groups and hydroxide groups:
depositing a halfnium oxide layer by atomic layer deposition.

17. The method of claim 16, wherein applying the sulfuric acid solution to the silicon substrate to grow the silicon dioxide layer comprises growing a monolayer of silicon dioxide on the silicon substrate.

18. The method of claim 16, wherein applying the sulfuric acid solution to the silicon substrate to grow the silicon dioxide layer comprises applying the sulfuric acid solution comprising approximately 98% by weight sulfuric acid.

19. The method of claim 16, wherein removing the first silicon dioxide layer from the silicon substrate comprises applying a solution comprising approximately 98% by weight sulfuric acid, approximately 1% by weight HF, and approximately 1% by weight water.

20. The method of claim 16, wherein applying the ammonium hydroxide solution to the silicon dioxide layer to terminate the silicon dioxide layer with ammonium groups and hydroxide groups comprises applying the ammonia hydroxide solution comprising water and ammonia hydroxide in the ratio of 500:1 by weight.

21. A method, comprising:
applying a high concentration sulfuric acid solution to a semiconductor substrate to grow a silicon dioxide layer; and
applying an ammonia hydroxide rinse to the silicon dioxide layer to terminate the silicon dioxide layer with hydroxide groups and ammonium groups,
wherein applying the ammonia hydroxide rinse comprises applying the ammonia hydroxide rinse comprising water and ammonia hydroxide in the ratio of 500:1 by weight.

22. The method of claim 21, wherein applying the ammonia hydroxide rinse to the silicon dioxide layer to terminate the silicon dioxide layer with hydroxide groups comprises terminating approximately 1%-10% of silicon atoms at a surface of the silicon dioxide layer with ammonium groups.

* * * * *